(12) United States Patent
Sisodia et al.

(10) Patent No.: US 11,830,542 B2
(45) Date of Patent: Nov. 28, 2023

(54) WORDLINE COUPLING TECHNIQUES

(71) Applicant: Arm Limited, Cambridge (GB)

(72) Inventors: Rajiv Kumar Sisodia, Bangalore (IN); Disha Singh, Bangalore (IN); Gautam Garg, Bangalore (IN); Srinivasan Srinath, Bangalore (IN); Georgy Jacob, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/897,716

(22) Filed: Aug. 29, 2022

(65) Prior Publication Data

US 2022/0415385 A1 Dec. 29, 2022

Related U.S. Application Data

(63) Continuation of application No. 16/786,779, filed on Feb. 10, 2020, now Pat. No. 11,430,506.

(51) Int. Cl.
*G11C 11/00* (2006.01)
*G11C 11/418* (2006.01)
*G11C 11/412* (2006.01)
*G11C 11/419* (2006.01)

(52) U.S. Cl.
CPC ......... *G11C 11/418* (2013.01); *G11C 11/412* (2013.01); *G11C 11/419* (2013.01)

(58) Field of Classification Search
CPC ... G11C 11/418; G11C 11/412; G11C 11/419; G11C 8/16
USPC .......................................... 365/154
See application file for complete search history.

(56) References Cited

U.S. PATENT DOCUMENTS

| | | | |
|---|---|---|---|
| 5,995,433 A * | 11/1999 | Liao | G11C 11/405 365/150 |
| 7,570,525 B2 | 8/2009 | Nii et al. | |
| 9,842,642 B2 | 12/2017 | Siddiqui et al. | |
| 2007/0217266 A1 * | 9/2007 | Kim | G11C 11/412 365/185.21 |
| 2014/0119101 A1 | 5/2014 | Wang et al. | |

* cited by examiner

*Primary Examiner* — Tha-O H Bui
(74) *Attorney, Agent, or Firm* — Pramudji Law Group PLLC; Ari Pramudji

(57) ABSTRACT

Various implementations described herein are directed to a device having a first read wordline formed in a first metal layer and a read wordline driver having an output node coupled to one or more memory cells via the first read wordline formed in the first metal layer. The device may include a second read wordline formed in a second metal layer that is different than the first metal layer, and the read wordline driver may have an input node coupled to the second read wordline formed in the second metal layer.

20 Claims, 6 Drawing Sheets

WORDLINE COUPLING TECHNIQUES

CROSS-REFERENCE TO RELATED APPLICATION

This application is a continuation application of and claims priority to U.S. patent application Ser. No. 16/786,779 filed 2020 Feb. 10, the entire disclosure of which is herein incorporated by reference in its entirety.

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In RF2 type memory (1-Read and 1-Write), two wordlines (Read-WL and Write-WL) are accommodated in the same height of a bitcell. Unfortunately, this makes the two wordlines, especially in lower technologies, not only narrow but also substantially close to each other, which can increase coupling capacitance between the two wordlines. Due to coupling between the two wordlines (Read-WL to Write-WL), write failures are observed in nano-sized devices when a falling Read-WL dips a Write-WL level, which impacts write operations. When attempting to recover write failures, performance is typically penalized by increasing the write window. As such, there exists a need to compensate for wordline coupling between read wordlines and write wordlines during read and write operations so as to improve write margins and also improve bitcell performance.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to read and write memory access schemes and techniques that improve wordline coupling capacitance in physical layout designs of memory structures. For instance, the various schemes and techniques described herein provide for a system or a device having wordline-coupling compensating memory cells for faster write cycles. Also, the various schemes and techniques described herein compensate for wordline coupling between read wordlines and write wordlines so as to improve write margins and bitcell performance during read and write operations. As such, the various schemes and techniques described herein compensate for degradation in write wordline levels due to coupling from read wordlines to improve write titres.

Various implementations of wordline coupling schemes and techniques will be described in detail herein with reference to FIGS. 1A-3.

FIGS. 1A-1D illustrate various schematic diagrams of memory circuitry 102 in accordance with various implementations described herein. In particular, FIG. 1A refers to a diagram 100A of memory circuitry 102A, FIG. 1B refers to another diagram 100B of memory circuitry 102B, FIG. 1C refers to another diagram 100C of memory circuitry 102C, and FIG. 1D refers to another diagram 100D of memory circuitry 102D. As shown in FIGS. 1A-1D, similar components provided therein have similar operational features, characteristics and behaviors as presented throughout the different embodiments.

In various instances, the memory circuitry 102 may refer to a system or a device having dual port memory architecture with multiple wordlines and multiple bitlines along with various logic circuitry that is fabricated with various physical cell layout schemes and techniques as described herein. The dual port memory architecture may be fabricated with the wordline coupling schemes and techniques described herein for the physical cell layout of the dual port memory architecture.

Also, in various instances, the memory circuitry 102 may be implemented as a system or a device having various integrated circuit (IC) components that are arranged and coupled together as an assemblage or combination of parts that provide for a physical circuit design and related structures. In some instances, a method of designing, providing and building the memory circuitry 102 as an integrated system or device may involve use of the various IC circuit components described herein so as to thereby implement wordline coupling schemes and techniques associated therewith. The memory circuitry 102 may be integrated with computing circuitry and related components on a single chip, and the memory circuitry 102 may be implemented in embedded systems for various electronic, mobile and Internet-of-things (IoT) applications, including sensor nodes.

Figure 1A:
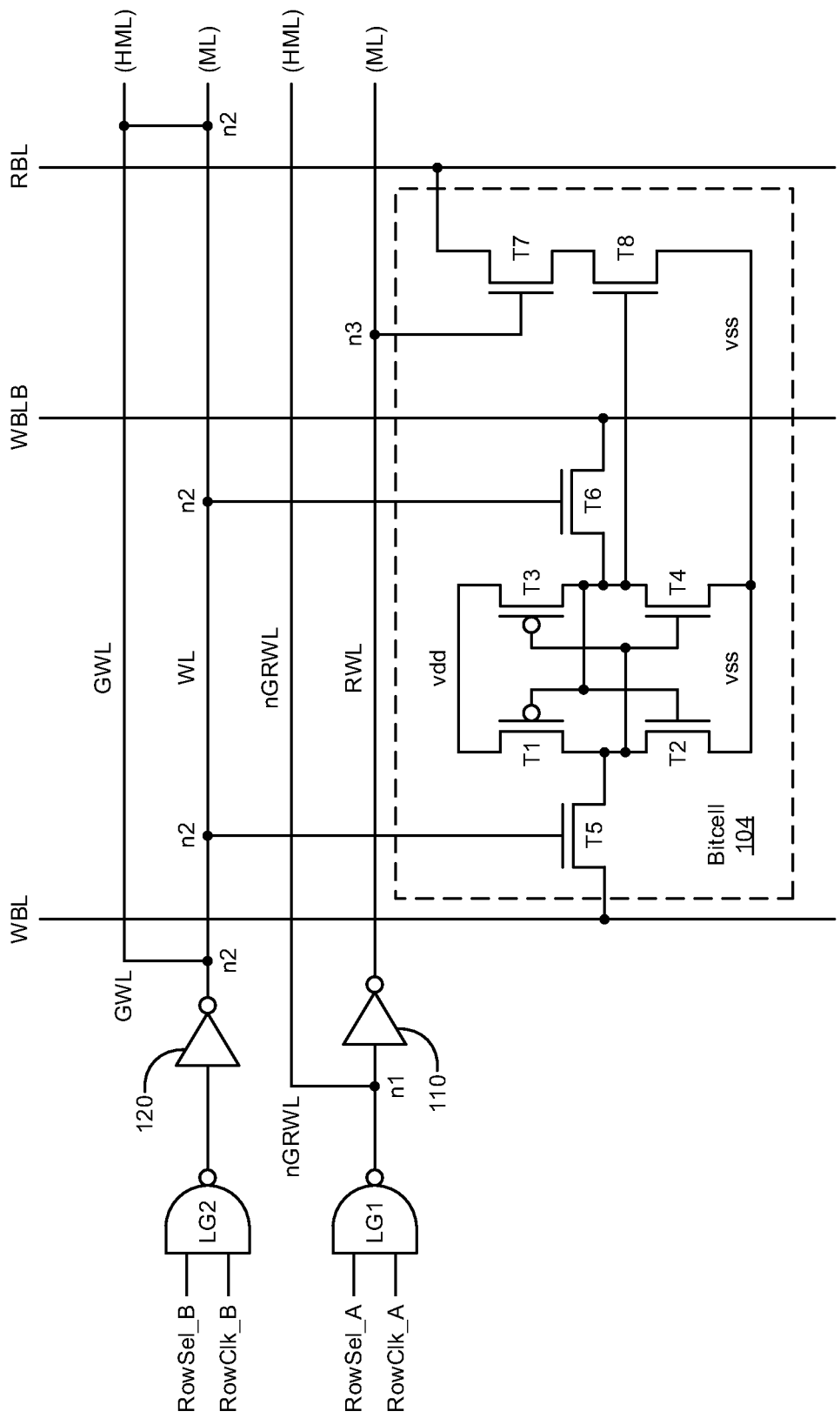
FIGS. 1A-1D illustrate various diagrams of memory circuitry in accordance with various implementations described herein.

As shown in FIG. 1A, the memory circuitry 102A includes a first read wordline (RWL) formed in a first metal layer (ML). In some implementations, the first metal layer (ML) may refer to a lower metal layer, such as, e.g., a metal-2 layer (M2 layer). In various other implementations, the lower metal layer (ML) may refer to other metal layers.

The memory circuitry 102A includes a read wordline driver 110 having an output node coupled to one or more memory cells (e.g., bitcell 104) via the first read wordline (RWL) formed in the first metal layer (ML). In some implementations, the memory circuitry 102A may be implemented as static random access memory (SRAM), and also, the one or more memory cells may be implemented with SRAM bitcells.

The memory circuitry 102A includes a second read wordline (nGRWL) formed in a second metal layer (HML) that is different than the first metal layer (ML), and the read wordline driver 110 has an input node coupled to the second read wordline (nGRWL) at node (n1) formed in the second metal layer (HML). Therefore, an inverted read wordline (nGRWL) may be routed in a higher metal layer (HML) so as to compensate for coupling between wordlines. In some implementations, the second metal layer (HML) refers to a higher metal layer, such as, e.g., a metal-4 layer (M4 layer), that is disposed above the first or lower metal layer (ML, e.g., M2 layer). In various other implementations, the higher metal layer (HML) may refer to other metal layers above the lower metal layer (ML).

In some instances, the first read wordline (RWL) provides a first conductive path having a first polarity, and also, the second read wordline (nGRWL) provides a second conductive path having a second polarity that is opposite the first polarity. The second metal layer (HML) may be formed in a higher metal layer (HML, such as, e.g., M4 layer, metal-4 layer) above the first metal layer (such as, e.g., ML: M2 layer: metal-2 layer). In various other implementations, the first metal layer (ML) and the second metal layer (HML) may be formed in various other different metal layers such that the second metal layer (HML) is above the first metal layer (ML).

In some instances, the memory circuitry 102A may include first row select logic (LG1) coupled to the input node of the read wordline driver 110 via the first read wordline (RWL), and the first row select logic (LG1) may be configured to receive a first row select signal (RowSel_A), receive a first row clock (RowClk_A), and provide a read wordline signal to the read wordline driver 110 via the first read wordline (RWL) based on the first row select signal (RowSel_A) and the first row clock (RowClk_A). The first row select logic (LG1) may provide the read wordline signal to the second read wordline (nGRWL) that is coupled between an output node of the first row select logic (LG1) and the input node of the read wordline driver 110. Also, the read wordline driver 110 may receive the read wordline signal from the first row select logic (LG1) via the first read wordline (RWL) and then provide an inverted read wordline signal to the one or more memory cells 104 via the first read wordline (RWL).

In some instances, the memory circuitry 102A may include a first write wordline (WL) formed in the first metal layer (ML) and a write wordline driver 120 having an output node coupled to the one or more memory cells 104 via the first write wordline (WL) formed in the first metal layer (ML). Also, the memory circuitry 102A may include a second write wordline (GWL) formed in the second metal layer (HML) that is different than the first metal layer (ML), and the output node of the write wordline driver 120 may be coupled to the second write wordline (GWL) formed in the second metal layer (HML). The memory circuitry 102A may include second row select logic (LG2) coupled to an input node of the write wordline driver 120 via the first write wordline WL), and the second row select logic (LG2) may receive a second row select signal (RowSel_B), receive a second row clock (RowClk_B), and then provide a write wordline signal to the write wordline driver 120 via the first write wordline (WL) based on the second row select signal (RowSel_B) and the second row clock (RowClk_B). In addition, the write wordline driver 120 may receive the write wordline signal from the second row select logic (LG2) via the first write wordline (WL) and provide an inverted write wordline signal to the one or more memory cells 104 via the first write wordline (WL), and also, the write wordline driver 120 may provide the inverted write wordline signal to the second write wordline (GWL).

In some implementations, the memory circuitry 102, 102A may refer to a dual-port memory structure with a dedicated write port and a dedicated read port. For instance, as shown in FIG. 1A, the memory circuitry 102 includes the write wordline (WL) and the read wordline (RWL) coupled to the one or more bitcells 104. The memory circuitry 102 also includes a pair of write bitlines (WBL, WBLB) and a read bitline (RBL) coupled to the one or more bitcells 104.

In some instances, the one or more bitcells 104 refer to static random access memory (SRAM) bitcells, which may have multiple access ports controlled by wordlines. The static RAM bitcells may be implemented with 8T bitcells, and multiple access ports may be varied within each bitcell so that some access ports are NFETs and some access ports are PFETs.

The one or more bitcells 104 may have multiple transistors arranged to store data during write operations and allow access of data during read operations. The one or more bitcells 104 may be implemented with eight transistors (8T), such as, e.g., transistors (T1, T2, T3, T4, T5, T6) arranged to store data during write operations, and transistors (T7, T8) arranged to read data during read operations. Transistors (T1, T2, T3, T4) are cross-coupled and disposed between source voltage (vdd) and ground (vss). Transistor (T5) is coupled between write bitline (WBL) and transistors (T1, T2), and transistor (T6) is coupled between write bitline (WBLB) and transistors (T3, T4), wherein the write bitline (WBLB) is a complement to write bitline (WBL). Also, the write wordline (WL) is coupled to gates of transistors (T5, T6) at node (n2). The transistors (T7, T8) are coupled in series between the read bitline (RBL) and ground (vss). In addition, the read wordline (RWL) may be coupled to a gate of transistor (T7) at node (n3), and a gate of the transistor (TA) may be coupled between transistors (T3, T4, T6).

Figure 1B:
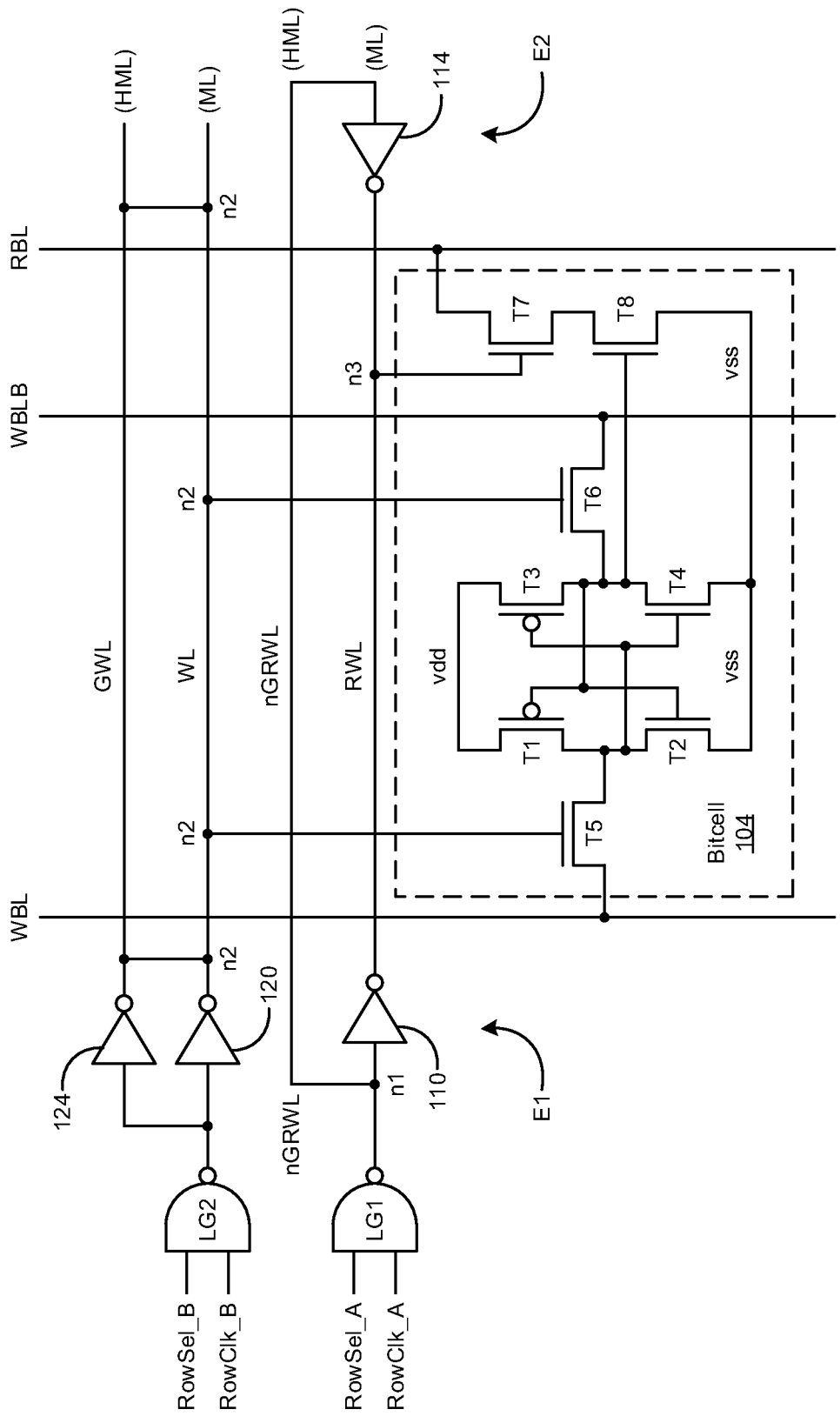
Figure 1C:
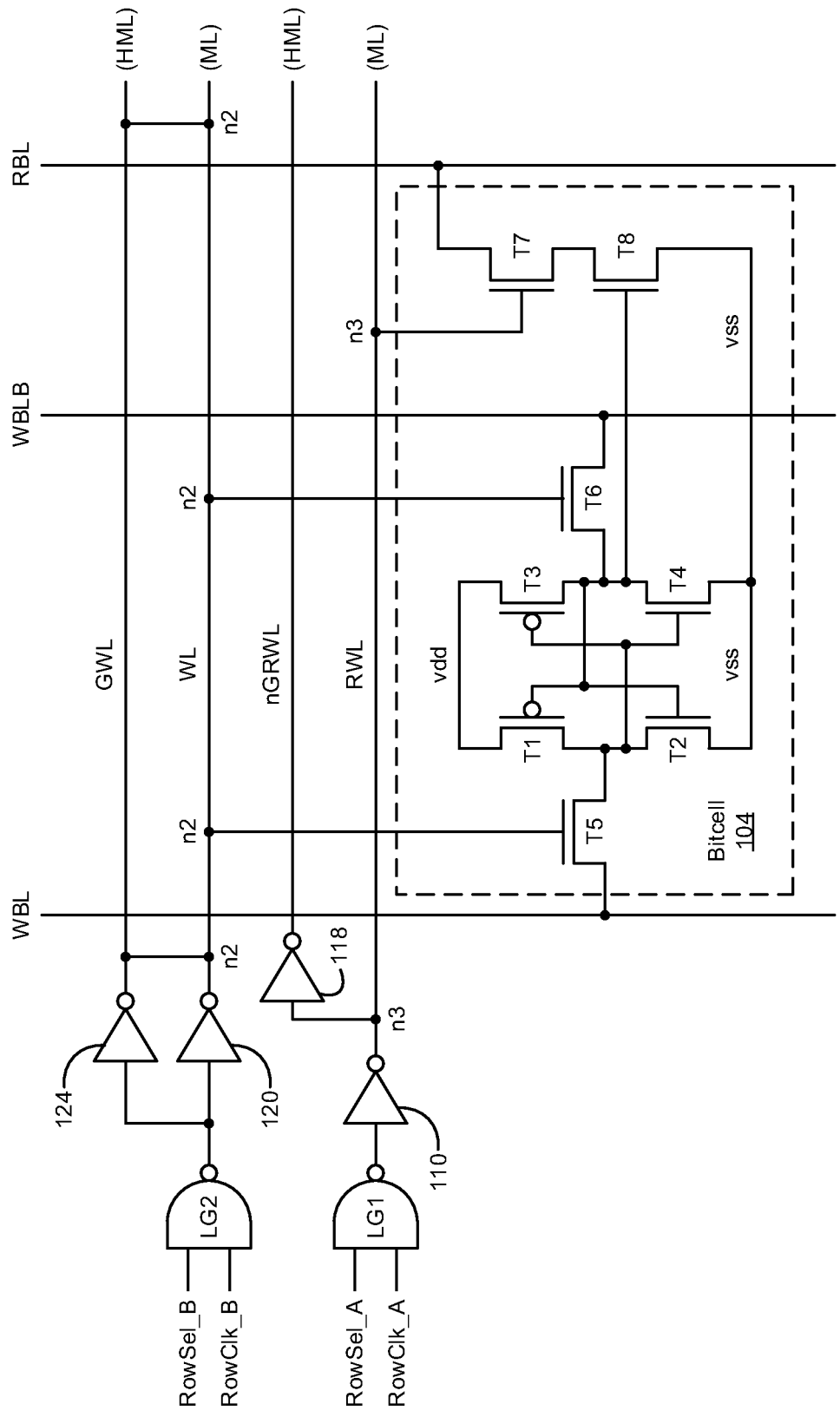
Figure 1D:
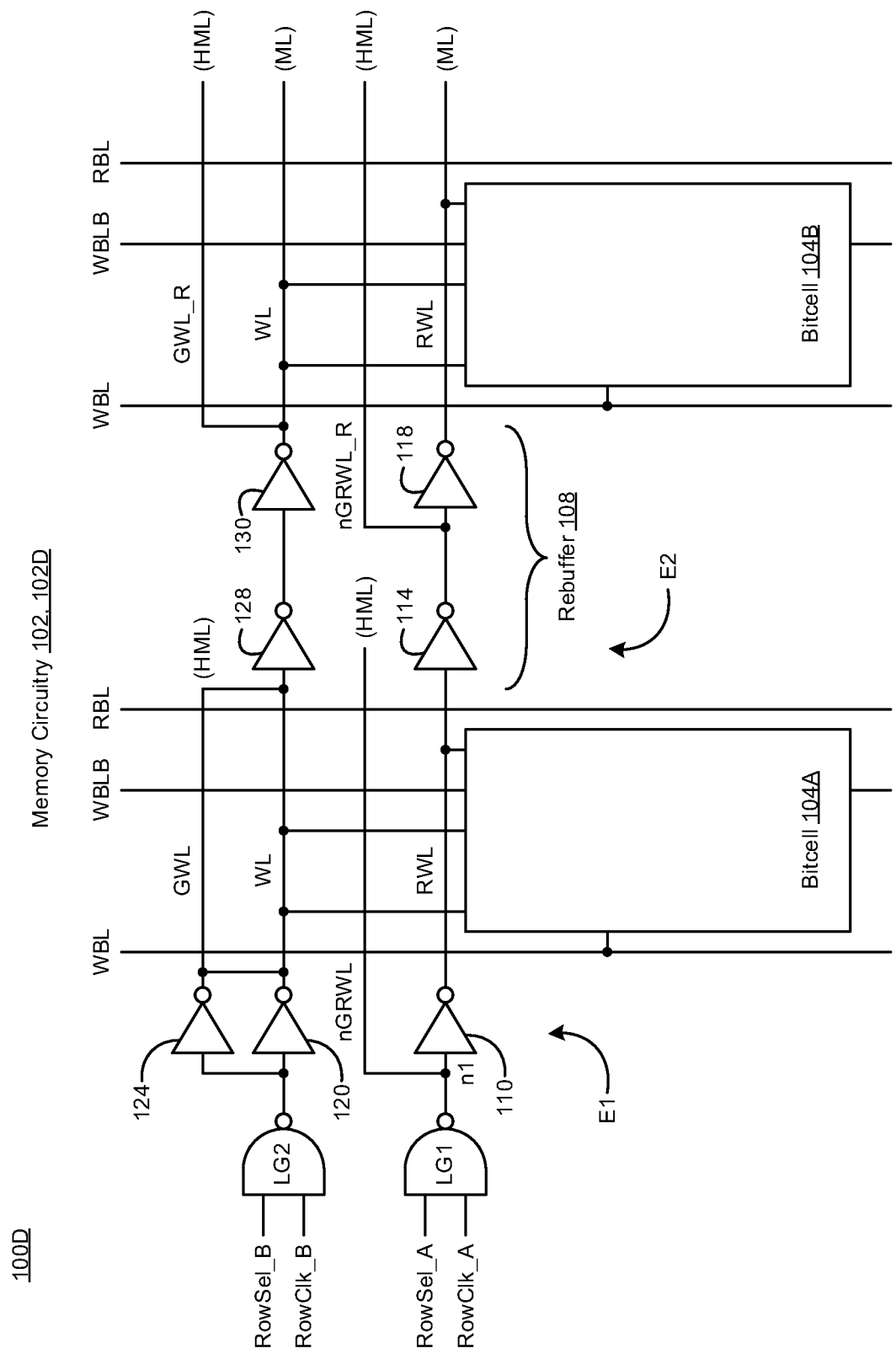

In various implementations, the memory circuitry 102A shown in FIG. 1A may be altered, changed and modified to provide similar operational features, characteristics and behaviors as presented throughout the different embodiments in FIGS. 1B-1D. For instance, as shown in FIG. 1B, the memory circuitry 102B may include multiple read wordline drivers 110, 114 and multiple write wordline drivers 120, 124. Thus, the memory circuitry 102B includes the read wordline driver 110 as a first read wordline driver coupled to the first read wordline (RWL) at a first end (E1) before the one or more memory cells 104, and also, the memory circuitry 102B may include a second read wordline driver 114 coupled between the second read wordline (nGRWL) and the first read wordline (RWL) at a second end (E2) of the first read wordline (RWL) after the one or more memory cells 104. In addition, the memory circuitry 102B may include the write wordline driver 120 as a first write wordline driver that is coupled to the first write wordline (WL) at the first end (E1) before the one or more memory cells 104, and also, the memory circuitry 102B may include a second write wordline driver 124 that is coupled to the second write wordline (nGRWL) at the first end (E1) of the second write wordline (GWL). Therefore, the inverted read wordline (nGRWL) may be routed in a higher metal layer (HML) to compensate for coupling, and the read wordline (RWL) may be boosted from another end (E2).

In some instances, during a collision case, when the read wordline (RWL) may be resetting, the falling read wordline (RWL) in the lower metal layer (e.g., ML) may couple onto a stable write wordline in the lower metal layer (e.g., ML) and attempts to briefly drop the voltage level of the stable write wordline. However, at the same time, the inverted read wordline (nGRWL) signal goes high (i.e., rises), which couples with GWL and attempts to briefly raise the voltage level of GWL. In this instance, the two opposite couplings allow for the write wordline (WL) to stay at Vdd such that write operations are not impacted.

As shown in FIG. 1C, the memory circuitry 102C may include the first read wordline (RWL) formed in the first metal layer (ML) and the read wordline driver 110 as a first read wordline driver having the output node coupled to the one or more memory cells 104 via the first read wordline (RWL) formed in the first metal layer (ML). The memory circuitry 102C may include the second read wordline (nGRWL) formed in the second metal layer (HML) that is different than the first metal layer (ML), and the second read wordline (nGRWL) may be coupled to the first read wordline (RWL) at the output node of the first read wordline driver 110. The memory circuitry 102C may include a second read wordline driver 118 having an input node and an output node. The input node of the second read wordline driver 118 may be coupled to the output node of the first read wordline driver 110, and the output node of the second read wordline driver 118 may be coupled to the second read wordline (nGRWL) formed in the second metal layer (HML).

In some instances, the first read wordline (RWL) provides a first conductive path having a first polarity, and also, the second read wordline (nGRWL) provides a second conductive path having a second polarity that is opposite the first polarity. In addition, the second metal layer (HML) is different than the first metal layer (ML), and the second metal layer (HML) is formed in a higher metal layer above the first metal layer (ML).

In some instances, the memory circuitry 102C includes the first write wordline (WL) formed in the first metal layer (ML) and the first write wordline driver 120 having the output node coupled to the one or more memory cells 104 at node (n2) via the first write wordline (WL) formed in the first metal layer (ML). The memory circuitry 102C may include the second write wordline (GWL) formed in the second metal layer (HML) that is different than the first metal layer (ML), and the input node of the first write wordline driver 120 is coupled to the second write wordline (GWL) formed in the second metal layer (HML). The memory circuitry 102C may include the second write wordline driver 124 having the input node and the output node. The input node of the second write wordline driver 124 may be coupled to the input node of the first write wordline driver 120, and the output node of the second read wordline driver 124 may be coupled to the second write wordline (GWL) formed in the second metal layer (HML).

In some implementations, as shown in FIG. 1D, the memory circuitry 102D may include rebuffer circuitry 108 that may allow for one or more additional bitcells 104 to be added along the read wordline (RWL) and the write wordline (WL). For instance, the memory circuitry 102D may include the first read wordline (RWL) formed in the first metal layer (ML) and the first read wordline driver 110 having the output node coupled to one or more first memory cells 104A via the first read wordline (RWL) formed in the first metal layer (ML). As shown, the first read wordline driver 110 may be coupled to the first read wordline (RWL) at the first end (E1) before the one or more first memory cells 104A. The memory circuitry 102D may include the second read wordline (nGRWL) that is formed in the second metal layer (HML), which is different than the first metal layer (ML), and also, the first read wordline driver 110 has the input node coupled to the second read wordline (nGRWL) formed in the second metal layer (HML). As shown, the second read wordline driver 114 may be coupled to the first read wordline (RWL) at the second end (E2) after the one or more first memory cells 104A.

In some instances, the memory circuitry 102D may include a third read wordline driver 118 coupled to the first read wordline (RWL), and the third read wordline driver 118 has an input node coupled to the output node of the second read wordline driver 114. The third read wordline driver 118 also has an output node coupled to the one or more second memory cells 104B via the first read wordline (RWL) that is formed in the first metal layer (ML). The memory circuitry 102D may include a third read wordline (nGRWL_R) formed in the second metal layer (HML) that is different than the first metal layer (ML), and the third read wordline (nGRWL_R) may be coupled to the first read wordline (RWL) between the second read wordline driver 114 and the third read wordline driver 118. The first read wordline (RWL) provides the first conductive path having the first polarity, and the second read wordline (nGRWL) provides the second conductive path having the second polarity that is opposite the first polarity, and the third read wordline (nGRWL_R) provides a third conductive path having the second polarity that is opposite the first polarity.

In some instances, the memory circuitry 102D includes the first write wordline (WL) formed in the first metal layer (ML) and the first write wordline driver 120 having the output node coupled to the one or more first memory cells 104A via the first write wordline (WL) formed in the first metal layer (ML). The first write wordline driver 120 is coupled to the first write wordline (WL) at the first end (E1) before the one or more first memory cells 104A. The memory circuitry 102D includes the second write wordline (GWL) formed in the second metal layer (HML) that is different than the first metal layer (ML), and the input node of the first write wordline driver 120 is coupled to the second write wordline (GWL) formed in the second metal layer (HML). The memory circuitry 102D includes the second write wordline driver 124 having the input node and the output node. Also, the input node of the second write wordline driver 124 may be coupled to the input node of the first write wordline driver 120, and the output node of the second write wordline driver 124 may be coupled to the second write wordline (GWL) formed in the second metal layer (HML).

In some instances, the memory circuitry 102D may include a third write wordline driver 128 coupled to the first write wordline (WL) at the second end (E2) after the one or more first memory cells 104B, and an input node of the third write wordline driver 128 is coupled to the output node of the first write wordline driver 120 via the first write wordline (WL). The input node of the third write wordline driver 128 is coupled to the output node of the second write wordline driver 124 via the second write wordline (GWL). The memory circuitry 102D may include a fourth write wordline driver 130 coupled to the first write wordline (WL), and the fourth write wordline driver 130 may have an input node coupled to an output node of the third write wordline driver 128. The fourth write wordline driver 130 may also have an output node coupled to the one or more second memory cells 104B via the first write wordline (WL) formed in the first metal layer (ML). The memory circuitry 102D may include a third write wordline (GWL_R) formed in the second metal layer (HML) that is different than the first metal layer (ML), and the third write wordline (GWL_R) may be coupled to the first write wordline (WL) at the output node of the fourth write wordline driver 130 before the one or more second memory cells 104B.

Figure 2:
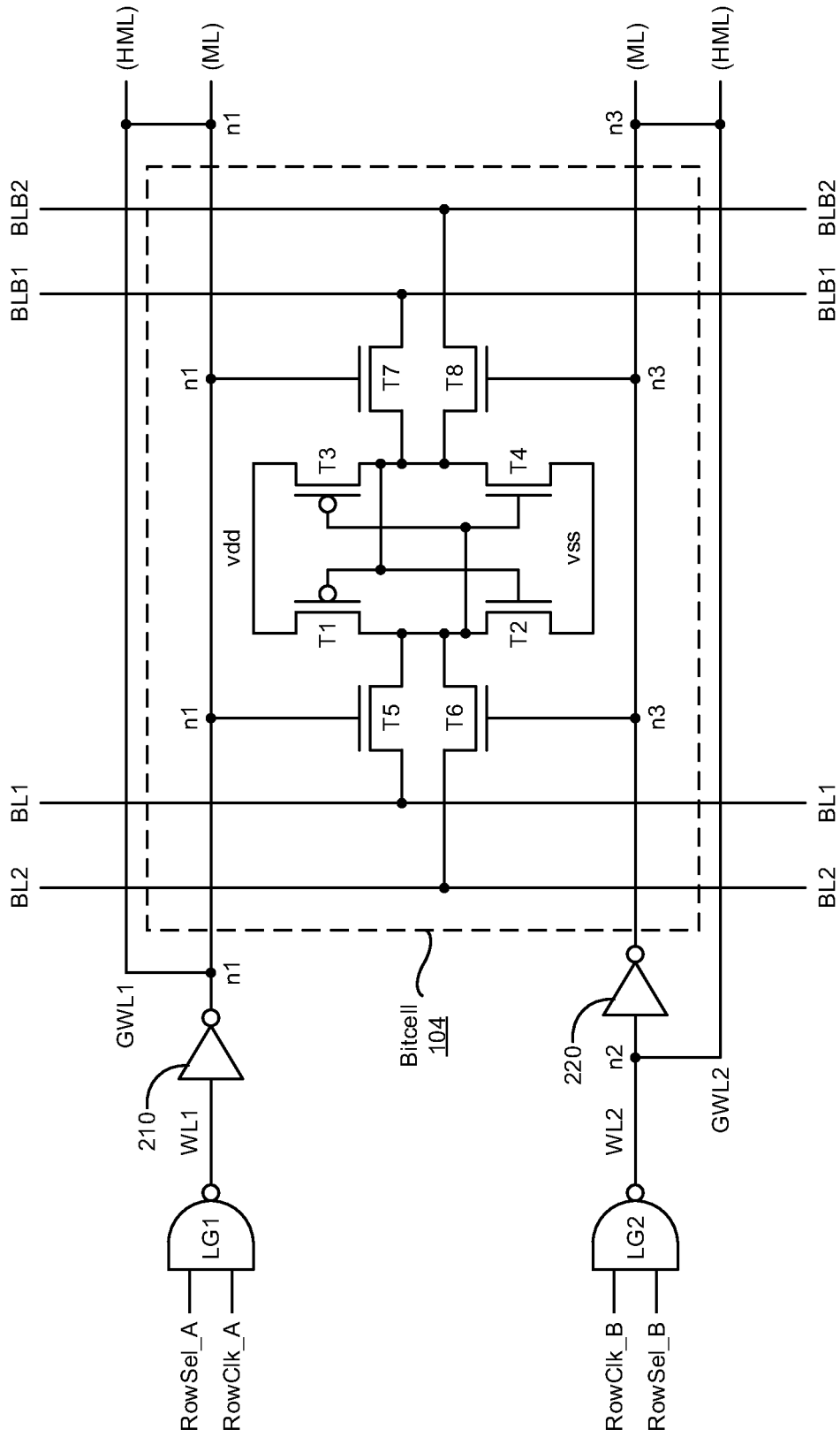
FIG. 2 illustrates another diagram of memory circuitry in accordance with various implementations described herein.

FIG. 2 illustrates a diagram 200 of memory circuitry 202 in accordance with various implementations described herein.

In some implementations, the memory circuitry 202 shown in FIG. 2 may be altered, changed and modified to provide similar operational features, characteristics and behaviors as presented in the different embodiments in FIGS. 1A-1D. For instance, as shown in FIG. 2, the memory circuitry 202 may include multiple bitline ports for bitlines (BL1/BLB1, BL2, BLB2) and multiple wordline ports for wordlines (WL1, WL2).

In some implementations, the memory circuitry 202 shown in FIG. 2 refers to a multi-port memory structure, such as, e.g., a dual-port memory structure with wordlines (WL1, WL2) and complementary bitlines (BL1/BLB1, BL2/BLB2) coupled to one or more bitcells 104. In some instances, the one or more bitcells 104 refer to static random access memory (RAM) bitcells, which may have access ports controlled by the wordlines (WL1, WL2) and the bitlines (BL1/BLB1, BL2/BLB2). In some instances, the static RAM bitcells may be implemented with 8T bitcells, and multiple access ports may be varied within each bitcell so that some access ports are NFETs and some access ports are PFETs.

In some implementations, the one or more bitcells 104 have multiple transistors arranged and configured to store data during write operations and to allow access of data during read operations. For instance, the one or more bitcells 104 may be implemented with eight transistors (8T), such as, e.g., transistors (T1, T2, T3, T4, T5, T6, T7, T8) that are arranged and configured to store data during write operations and read data during read operations. As shown, transistors (T1, T2, T3, T4) are cross-coupled and disposed between source voltage (vdd) and ground (vss). Transistor (T5) is coupled between bitline (BL1) and transistors (T1, T2), and transistor (T7) is coupled between bitline (BLB1) and transistors (T3, T4), wherein the bitline (BLB1) is a complement to bitline (BL1). Similarly, transistor (T6) is coupled between bitline (BL2) and transistors (T1, T2), and transistor (T8) is coupled between bitline (BLB2) and transistors (T3, T4), wherein the bitline (BLB2) is a complement to bitline (BL2). In addition, as shown, a first wordline (WL1) is coupled to gates of access transistors (T5, T7) at node (n1), and also, a second wordline (WL2) is coupled to gates of other access transistors (T6, T8) at node (n3).

In some instances, the memory circuitry 202 may include a first wordline driver 210 coupled to the first wordline (WL1), and the memory circuitry 202 may include a first coupling wordline (GWL1) coupled to an output of the first wordline driver 210, wherein the wordlines (WL1, GWL1) are disposed in different metal layers (ML, HML). Also, the memory circuitry 202 may include a second wordline driver 220 coupled to the second wordline (WL2), and the memory circuitry 202 may include a second coupling wordline (GWL2) coupled to an input of the second wordline driver 220, wherein the wordlines (WL2, GWL2) are disposed in different metal layers (ML, HML). Thus, the first and second wordlines (WL1, WL2) may be disposed in a first metal layer (ML), and the first and second coupling wordlines (GWL1, GWL2) may be disposed in a second metal layer (HML) that is a higher metal layer than the first metal layer (ML). For instance, the first metal layer (ML) may be formed in metal-2 layer (i.e., M2 layer), and the second metal layer (HML) may be formed in a metal-4 layer (i.e., M4 layer).

In some instances, the memory circuitry 202 includes the first row select logic (LG1) coupled to an input node of the first wordline driver 210 via the first wordline (WL1), and as shown, the first wordline driver 210 is coupled between the first row select logic (LG1) and the node (n1). Also, the memory circuitry 202 includes the second row select logic (LG2) coupled to an input node of the second wordline driver 220 via the second wordline (WL2), and as shown, the node (n2) is coupled between the second row select logic (LG2) and the second wordline driver 220.

Figure 3:
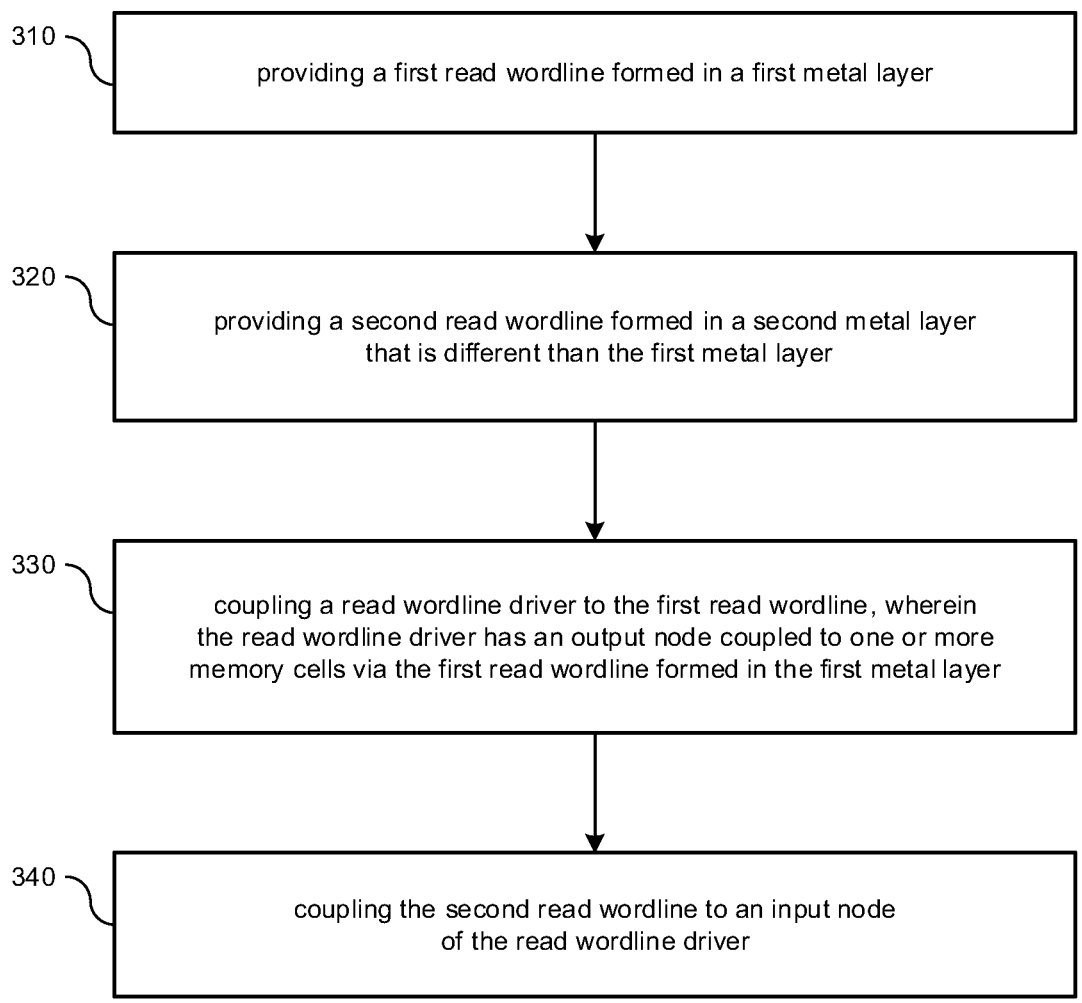
FIG. 3 illustrates a process diagram of a method for utilizing wordline coupling techniques in accordance with various implementations described herein.

FIG. 3 illustrates a process flow diagram of a method 300 for utilizing wordline coupling techniques in accordance with implementations described herein.

It should be understood that even though method 300 may indicate a particular order of operation execution, in some cases, various portions of the operations may be executed in a different order, and on different systems. In other cases, various additional operations and/or steps may be added to and/or omitted from method 300. Method 300 may be implemented in hardware and/or software. If implemented in hardware, method 300 may be implemented with various components and/or circuitry, as described herein below in reference to FIGS. 1A-2. Also, if implemented in software, method 300 may be implemented as programs and/or software instruction processes that are configured for wordline coupling schemes and techniques, as described herein. Also, if implemented in software, various instructions related to implementing method 300 may be stored in memory and/or a database. Also, in other instances, a computer or various other types of computing devices having at least one processor and memory may be configured to perform method 300 along with various instruction sequences related thereto.

As shown in reference to FIG. 3, in block 310, method 300 may provide a first read wordline formed in a first metal layer (ML). In block 320, method 300 may provide a second read wordline formed in a second metal layer that is different than the first metal layer (HML). In block 330, method 300 may couple a read wordline driver to the first read wordline, and the read wordline driver has an output node coupled to one or more memory cells via the first read wordline formed in the first metal layer (ML). In block 340, method 300 may couple the second read wordline to an input node of the read wordline driver.

In some implementations, the first read wordline provides a first conductive path having a first polarity, and the second read wordline provides a second conductive path having a second polarity that is opposite the first polarity. Also, the second metal layer (HML) may be formed in a higher metal layer (e.g., HML: M4 layer: metal-4 layer) above the first metal layer (e.g., ML: M2 layer: metal-2 layer). In other implementations, the first and second metal layers may be formed in various other different metal layers.

In some instances, method 300 may provide first row select logic coupled to the input node of the read wordline driver via the first read wordline, and the first row select logic may be configured to receive a first row select signal, receive a first row clock, and provide a read wordline signal to the read wordline driver via the first read wordline based on the first row select signal and the first row clock. The first row select logic may provide the read wordline signal to the second read wordline that is coupled between an output node of the first row select logic and the input node of the read wordline driver. The read wordline driver may receive the read wordline signal from the first row select logic via the first read wordline and provide an inverted read wordline signal to the one or more memory cells via the first read wordline.

In some instances, method 300 may provide a first write wordline formed in the first metal layer, provide a write wordline driver having an output node coupled to the one or more memory cells via the first write wordline formed in the first metal layer; and also provide a second write wordline formed in the second metal layer that is different than the first metal layer. In this instance, the output node of the write wordline driver is coupled to the second write wordline formed in the second metal layer. Method 300 may provide second row select logic coupled to an input node of the write wordline driver via the first write wordline, and the second row select logic may receive a second row select signal, receive a second row clock, and provide a write wordline signal to the write wordline driver via the first write wordline based on the second row select signal and the second row clock. The write wordline driver may receive the write wordline signal from the second row select logic via the first write wordline and provide an inverted write wordline signal to the one or more memory cells via the first write wordline. Also, the write wordline driver may provide the inverted write wordline signal to the second write wordline.

In some instances, the read wordline driver may include a first read wordline driver coupled to the first read wordline at a first end before the one or more memory cells, and method 300 may provide a second read wordline driver coupled between the second read wordline and the first read wordline at a second end of the first read wordline after the one or more memory cells. Also, method 300 may provide the various components described herein as part of static random access memory (SRAM), and the one or more memory cells may include SRAM bitcells.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include a first read wordline formed in a first metal layer. The device may include a read wordline driver having an output node coupled to one or more memory cells via the first read wordline formed in the first metal layer. The device may also include a second read wordline formed in a second metal layer that is different than the first metal layer, and in this instance, the read wordline driver may have an input node coupled to the second read wordline formed in the second metal layer.

Described herein are various implementations of a device. The device may include a first read wordline formed in a first metal layer. The device may include a first read wordline driver having an output node coupled to one or more memory cells via the first read wordline formed in the first metal layer. The device may include a second read wordline formed in a second metal layer that is different than the first metal layer, and the second read wordline may be coupled to the first read wordline at the output node of the first read wordline driver. The device may include a second read wordline driver having an input node and an output node. The input node of the second read wordline driver may be coupled to the output node of the first read wordline driver, and the output node of the second read wordline driver maybe coupled to the second read wordline formed in the second metal layer.

Described herein are various implementations of a device. The device may include a first read wordline formed in a first metal layer. The device may include a first read wordline driver having an output node coupled to first memory cells via the first read wordline formed in the first metal layer, and the first read wordline driver may be coupled to the first read wordline at a first end before the first memory cells. The device may also include a second read wordline formed in a second metal layer that is different than the first metal layer, and the first read wordline driver may have an input node coupled to the second read wordline formed in the second metal layer. The device may include a second read wordline driver that is coupled to the first read wordline at a second end after the first memory cells.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
a first read wordline formed in a first metal layer;
a first read wordline driver having an output node coupled to one or more memory cells via the first read wordline formed in the first metal layer;
a second read wordline formed in a second metal layer that is different than the first metal layer, wherein the second read wordline is coupled to the first read wordline at the output node of the first read wordline driver; and
a second read wordline driver having an input node and an output node, wherein the input node of the second read wordline driver is coupled to the output node of the first read wordline driver, and wherein the output node of the second read wordline driver is coupled to the second read wordline formed in the second metal layer.

2. The device of claim 1, wherein the first read wordline provides a first conductive path having a first polarity, and wherein the second read wordline provides a second conductive path having a second polarity that is opposite the first polarity.

3. The device of claim 1, wherein the second metal layer is formed in a higher metal layer above the first metal layer.

4. The device of claim 1, further comprising:
first row select logic coupled to the input node of the first read wordline driver and the second read wordline driver via the first read wordline,
wherein the first row select logic receives a first row select signal, receives a first row clock, and provides a read wordline signal to the first read wordline driver and the second read wordline driver via the first read wordline based on the first row select signal and the first row clock.

5. The device of claim 4, wherein:
the first row select logic provides the read wordline signal to the second read wordline via the second read wordline driver that is coupled between an output node of the first row select logic and the second read wordline, and
the second read wordline driver receives the read wordline signal from the first row select logic via the first read wordline and provides an inverted read wordline signal to the one or more memory cells via the second read wordline.

6. The device of claim 1, further comprising:
a first write wordline formed in the first metal layer;
a first write wordline driver having an output node coupled to the one or more memory cells via the first write wordline formed in the first metal layer; and
a second write wordline formed in the second metal layer that is different than the first metal layer, wherein the input node of the first write wordline driver is coupled to the second write wordline formed in the second metal layer.

7. The device of claim 6, further comprising:
a second write wordline driver having an output node coupled to the one or more memory cells via the second write wordline formed in the second metal layer;
the second write wordline driver has an input node and an output node,
the input node of the second write wordline driver is coupled to the input node of the first write wordline driver, and
the output node of the second write wordline driver is coupled to the second write wordline formed in the second metal layer.

8. The device of claim 7, further comprising:
second row select logic coupled to an input node of the first write wordline driver and the second write wordline driver via the first write wordline,
wherein the second row select logic receives a second row select signal, receives a second row clock, and provides a write wordline signal to the first write wordline driver and the second write wordline driver via the first write wordline based on the second row select signal and the second row clock.

9. The device of claim 8, wherein:
the first write wordline driver receives the write wordline signal from the second row select logic via the first write wordline and provides an inverted write wordline signal to the one or more memory cells via the first write wordline, and
the second write wordline driver receives the write wordline signal from the second row select logic via the first write wordline and provides an inverted write wordline signal to the one or more memory cells via the second write wordline.

10. A device, comprising:
a first write wordline formed in a first metal layer;
a first write wordline driver having an output node coupled to one or more memory cells via the first write wordline formed in the first metal layer; and
a second write wordline formed in a second metal layer that is different than the first metal layer, wherein the input node of the first write wordline driver is coupled to the second write wordline formed in the second metal layer, and wherein the second write wordline is coupled to the first write wordline.

11. The device of claim 10, wherein the second metal layer is formed in a higher metal layer above the first metal layer.

12. The device of claim 10, further comprising:
a first read wordline formed in the first metal layer;
a first read wordline driver having an output node coupled to the one or more memory cells via the first read wordline formed in the first metal layer;
a second read wordline formed in the second metal layer that is different than the first metal layer, wherein the second read wordline is coupled to the first read wordline at the output node of the first read wordline driver; and
a second read wordline driver having an input node and an output node, wherein the input node of the second read wordline driver is coupled to the output node of the first read wordline driver, and wherein the output node of the second read wordline driver is coupled to the second read wordline formed in the second metal layer.

13. The device of claim 12, wherein the first read wordline provides a first conductive path having a first polarity, and wherein the second read wordline provides a second conductive path having a second polarity that is opposite the first polarity.

14. The device of claim 10, further comprising:
a second write wordline driver having an output node coupled to the one or more memory cells via the second write wordline formed in the second metal layer;

the second write wordline driver has an input node and an output node, the input node of the second write wordline driver is coupled to the input node of the first write wordline driver, and the output node of the second write wordline driver is coupled to the second write wordline formed in the second metal layer.

15. A device comprising:

a first write wordline formed in a first metal layer;

a first write wordline driver having an output node coupled to one or more memory cells via the first write wordline formed in the first metal layer;

a second write wordline formed in a second metal layer that is different than the first metal layer, wherein the input node of the first write wordline driver is coupled to the second write wordline formed in the second metal layer;

a first read wordline formed in the first metal layer;

a first read wordline driver having an output node coupled to the one or more memory cells via the first read wordline formed in the first metal layer;

a second read wordline formed in the second metal layer that is different than the first metal layer, wherein the second read wordline is coupled to the first read wordline at the output node of the first read wordline driver;

a second read wordline driver having an input node and an output node, wherein the input node of the second read wordline driver is coupled to the output node of the first read wordline driver, and wherein the output node of the second read wordline driver is coupled to the second read wordline formed in the second metal layer; and first row select logic coupled to the input node of the first read wordline driver via the first read wordline, wherein the first row select logic receives a first row select signal, receives a first row clock, and provides a read wordline signal to the first read wordline driver via the first read wordline based on the first row select signal and the first row clock.

16. The device of claim 15, wherein:

the first row select logic provides the read wordline signal to the second read wordline that is coupled between an output node of the first row select logic and the input node of the second read wordline driver, and the first read wordline driver receives the read wordline signal from the first row select logic via the first read wordline and provides an inverted read wordline signal to the one or more memory cells via the first read wordline.

17. A device of comprising:

a first write wordline formed in a first metal layer;

a first write wordline driver having an output node coupled to one or more memory cells via the first write wordline formed in the first metal layer;

a second write wordline formed in a second metal layer that is different than the first metal layer, wherein the input node of the first write wordline driver is coupled to the second write wordline formed in the second metal layer;

a second write wordline driver having an output node coupled to the one or more memory cells via the second write wordline formed in the second metal layer; and second row select logic coupled to an input node of the first write wordline driver and the second write wordline driver via the first write wordline, wherein the second write wordline driver has an input node and an output node, wherein the input node of the second write wordline driver is coupled to the input node of the first write wordline driver, wherein the output node of the second write wordline driver is coupled to the second write wordline formed in the second metal layer, and wherein the second row select logic receives a second row select signal, receives a second row clock, and provides a write wordline signal to the first write wordline driver and the second write wordline driver via the first write wordline based on the second row select signal and the second row clock.

18. The device of claim 17, wherein:

the first write wordline driver receives the write wordline signal from the second row select logic via the first write wordline and provides an inverted write wordline signal to the one or more memory cells via the first write wordline, and the second write wordline driver receives the write wordline signal from the second row select logic via the first write wordline and provides an inverted write wordline signal to the one or more memory cells via the second write wordline.

19. A device, comprising:

a first read wordline and a first write wordline formed in a first metal layer;

a first read wordline driver having an output node coupled to one or more memory cells via the first read wordline formed in the first metal layer;

a first write wordline driver having an output node coupled to the one or more memory cells via the first write wordline formed in the first metal layer; and a second read wordline and a second write wordline formed in a second metal layer, wherein the second metal layer is different than the first metal layer, wherein the second read wordline is coupled to the first read wordline at the output node of the first read wordline driver, and wherein the second write wordline is coupled to the first write wordline.

20. The device of claim 19, further comprising:

a second read wordline driver having an input node and an output node, wherein the input node of the second read wordline driver is coupled to the output node of the first read wordline driver, and wherein the output node of the second read wordline driver is coupled to the second read wordline formed in the second metal layer;

a second write wordline formed in the second metal layer that is different than the first metal layer, wherein the input node of the first write wordline driver is coupled to the second write wordline formed in the second metal layer, wherein the second metal layer is formed in a higher metal layer above the first metal layer, wherein the first read wordline provides a first conductive path having a first polarity, and wherein the second read wordline provides a second conductive path having a second polarity that is opposite the first polarity.

* * * * *